(12) United States Patent
Johnson et al.

(10) Patent No.: US 8,134,086 B2
(45) Date of Patent: Mar. 13, 2012

(54) ELECTRICAL ISOLATING STRUCTURE FOR CONDUCTORS IN A SUBSTRATE

(75) Inventors: George A. Johnson, Dewitt, NY (US); Jeffrey K. Rowe, Baldwinsville, NY (US); James S. Hong, Manlius, NY (US); Manochehr Timajchy, Sugar Hill, GA (US)

(73) Assignee: Lockheed Martin Corporation, Bethesda, MD (US)

( * ) Notice: Subject to any disclaimer, the term of this patent is extended or adjusted under 35 U.S.C. 154(b) by 427 days.

(21) Appl. No.: 12/372,147

(22) Filed: Feb. 17, 2009

(65) Prior Publication Data

US 2010/0206617 A1    Aug. 19, 2010

(51) Int. Cl.
*H05K 1/11* (2006.01)
(52) U.S. Cl. ...................................................... 174/262
(58) Field of Classification Search ................. 174/262, 174/263, 264, 265, 266, 251; 361/792
See application file for complete search history.

(56) References Cited

U.S. PATENT DOCUMENTS

| | | | | |
|---|---|---|---|---|
| 3,293,353 A | * | 12/1966 | Hendriks et al. ................ | 174/36 |
| 4,816,616 A | | 3/1989 | Jones | |
| 5,426,399 A | * | 6/1995 | Matsubayashi et al. .......... | 333/1 |
| 5,677,515 A | | 10/1997 | Selk et al. | |
| 5,875,158 A | | 2/1999 | Schell | |
| 6,353,189 B1 | * | 3/2002 | Shimada et al. ............... | 174/255 |
| 6,444,922 B1 | | 9/2002 | Kwong | |
| 6,747,216 B2 | * | 6/2004 | Brist et al. ..................... | 174/262 |
| 6,872,595 B1 | * | 3/2005 | Kwong et al. ................ | 438/109 |
| 7,061,095 B2 | | 6/2006 | Boggs et al. | |
| 7,145,083 B2 | * | 12/2006 | Kwong et al. ................ | 174/260 |
| 2005/0095410 A1 | | 5/2005 | Mazurkiewicz | |
| 2006/0024865 A1 | | 2/2006 | Underwood et al. | |

OTHER PUBLICATIONS

International Search Report dated Apr. 10, 2010 for related International Application No. PCT/US 10/24438.

* cited by examiner

*Primary Examiner* — Hae Moon Hyeon
(74) *Attorney, Agent, or Firm* — Howard IP Law Group (57) ABSTRACT

A substrate has a first dielectric layer; a first conductive layer on the first dielectric layer; a second dielectric layer on the first conductive layer; an elongated signal conductor embedded within the second dielectric layer; a second conductive layer on the second dielectric layer; a first conductive groove and second conductive groove through the second conductive layer, the second dielectric layer, the first conductive layer and into the first dielectric layer and extending continuously along the length of and on opposing sides of the signal conductor, the grooves having conductive side walls providing an electrical connection between the first conductive layer and the second conductive layer; first and second conductive end walls joining the first groove and second groove; and at least one insulating area through at least one of the first and second conductive layers to provide conductor access.

20 Claims, 12 Drawing Sheets

ELECTRICAL ISOLATING STRUCTURE FOR CONDUCTORS IN A SUBSTRATE

FIELD OF INVENTION

The present invention relates to structures for providing electrical isolation between conductors in substrates, such as signal traces in printed circuit boards.

BACKGROUND OF THE INVENTION

Electrical current flow through conductors in multiple layered, printed circuit boards (PCBs) often contributes to crosstalk between and among conductors thus limiting the effectiveness and reliability of an application. Conductors in the form of clad runs are mutually influenced depending on their proximity to each other as well as signal power levels, switching rise and fall times and frequency rates. For many radio frequency (RF) applications the degree of isolation between and among conductors and other circuit features such as vias needs to exceed 65 dB. Crosstalk generally occurs by: (1) radiation from one conductor through the substrate and received by another; and/or (2) radiation outside the substrate from one electrical conductor and received by another on the substrate. To reduce crosstalk between clad runs metal shields are often employed. Another method for isolating an electrical feature within a PCB dielectric substrate is to surround the feature with metalized stitching vias connected to ground at top and bottom. These vias may take on one of several different patterns, such as uniform rows, double rows and randomized positioning.

Figure 1:
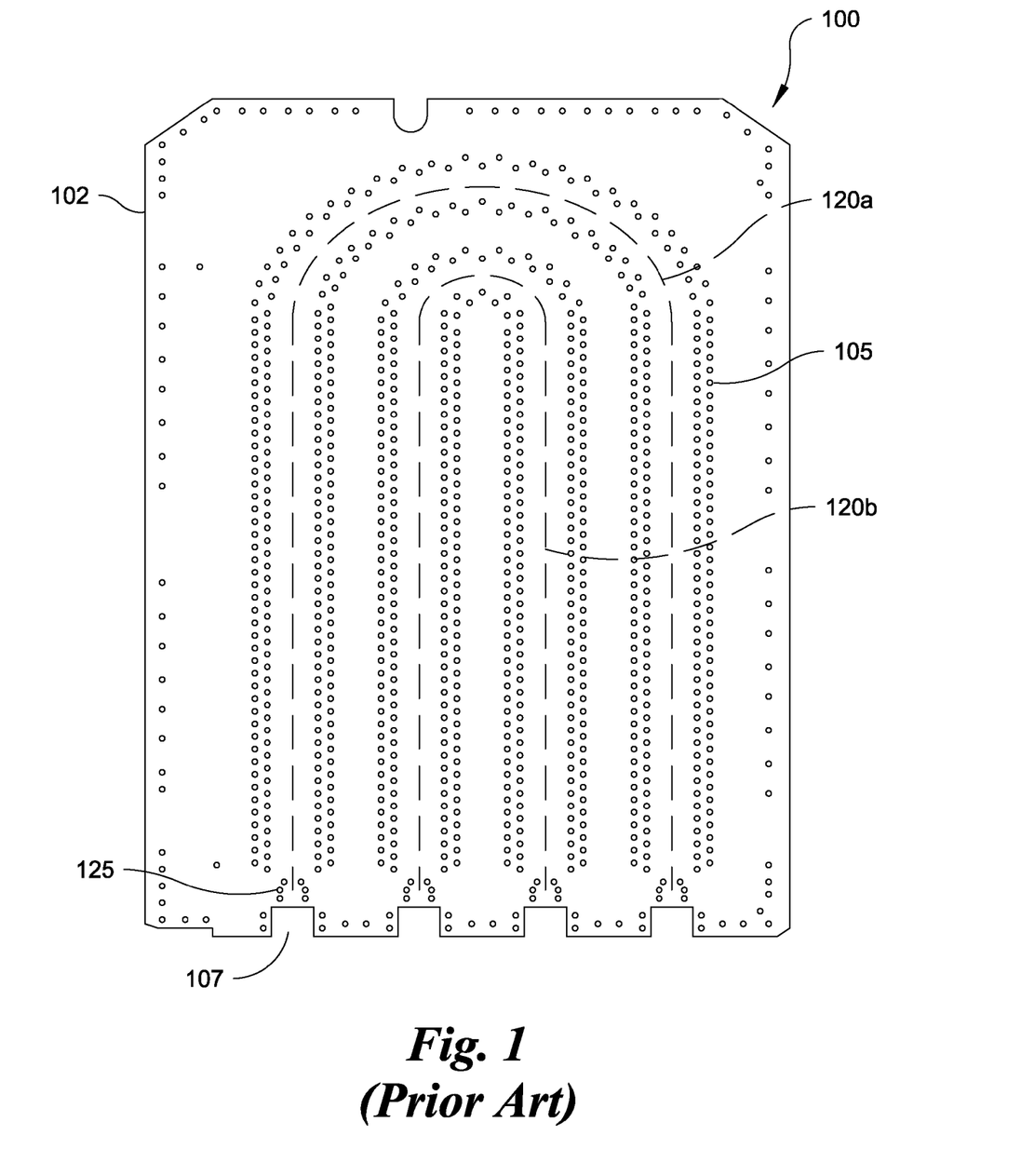
FIG. 1 illustrates stitching vias to isolate an electrical feature within a PCB substrate according to the prior art.

A PCB is a composite dielectric material of organic and/or inorganic fabric impregnated with resin having a copper-clad laminate bonded thereto. The copper is then patterned using resists and etched. A multilayer PCB is achieved when two or more sheets of dielectric material having patterned copper bonded thereto are laminated under heat and pressure. The interconnection between components and conductors in these dielectric layers are effectuated through via holes, which are metal plated to provide the electrical connections between respective layers. Ground and power planes distribute voltages to the circuit components. A prior art configuration typical of a stripline design is shown in FIG. 1. Note in FIG. 1 that the PCB 100 has a dielectric layer 102 and an internal conductor (stripline) embedded therein at a location indicated by dashed line 120a that is circumscribed by a stitching via scheme 105 of uniform double rows of metalized vias, although other designs may use single and randomized via positions. These stitching vias serve to electrically isolate the conductor at line 120a from the adjacent conductor embedded in PCB 100 at a location indicated by dashed line 120b. The isolation provided by any of these methods is limited to the how close one feature, such as a via 125, can be installed to another feature such as a connector installed in slot 107. The effectiveness of the stitching via method of isolation diminishes as the operating frequency increases.

The problem of mutual coupling also arises in substrates other than PCBs. By way of example, the problem of mutual coupling may be encountered in thick film technology.

SUMMARY OF THE INVENTION

In an embodiment, a substrate has dielectric layers; an elongated signal conductor embedded within a first of the dielectric layers; an upper conductive layer on an upper surface of the first dielectric layer; a lower conductive layer on a lower surface of the first dielectric layer; a first conductive groove and second conductive groove through the first dielectric layer and extending continuously along the length of and on opposing sides of the signal conductor, said grooves having conductive side walls providing an electrical connection between the upper conductive layer and the lower conductive layer; first and second conductive end walls joining the first groove and second groove; and at least one insulating signal access area in alignment with the signal conductor and through at least one of the upper and lower conductive surfaces to provide conductor access.

In an embodiment, a method for manufacturing a multilayer substrate includes providing a first planar dielectric layer; forming a first conductive reference plane on the first planar dielectric layer; providing a second planar dielectric layer on the first conductive reference plane; forming an elongated signal conductor on the second planar dielectric layer; providing a third planar dielectric layer on the signal conductor and the second planar dielectric layer; defining on each side of the elongated signal conductor a groove extending continuously the entire length of the elongated signal conductor through the third planar dielectric layer, the second planar dielectric layer and the first reference plane, the grooves having inner walls joining to one another beyond opposing ends of the elongated signal conductor; and applying a conductive layer on the grooves, including the inner walls, and on an upper surface of the third planar dielectric layer; and defining an insulating signal access area in alignment with the signal conductor and through at least one of the first reference plane and the conductive layer on the upper surface of the third planar dielectric layer.

In an embodiment, a structure for isolating a signal conductor in a substrate has a first planar dielectric layer, a first conductive reference plane on the first planar dielectric layer, a second planar dielectric layer on the first conductive reference plane, an elongated signal conductor on the second planar dielectric layer, a third planar dielectric layer on the signal conductor and the second planar dielectric layer, two grooves on opposite sides of the elongated signal conductor through the third planar dielectric layer, the second planar dielectric layer and the first reference plane, the grooves having inner walls joining to one another beyond opposing ends of the elongated signal conductor, the grooves having a conductive layer on their inner walls and in electrical contact with the first reference plane; and a conductive layer on an upper surface of the third planar dielectric layer in electrical contact with the conductive layer on the walls of the grooves; and an insulating signal access area, in alignment with said signal conductor, defined through the conductive layer on the upper surface of the third planar dielectric layer.

BRIEF DESCRIPTION OF THE DRAWINGS

Understanding of the present invention will be facilitated by consideration of the following detailed description of the preferred embodiments of the present invention taken in conjunction with the accompanying drawings, in which like numerals refer to like parts and.

DETAILED DESCRIPTION

The following description of the preferred embodiments is merely by way of example and is not intended to limit the invention or its application.

Figure 2:
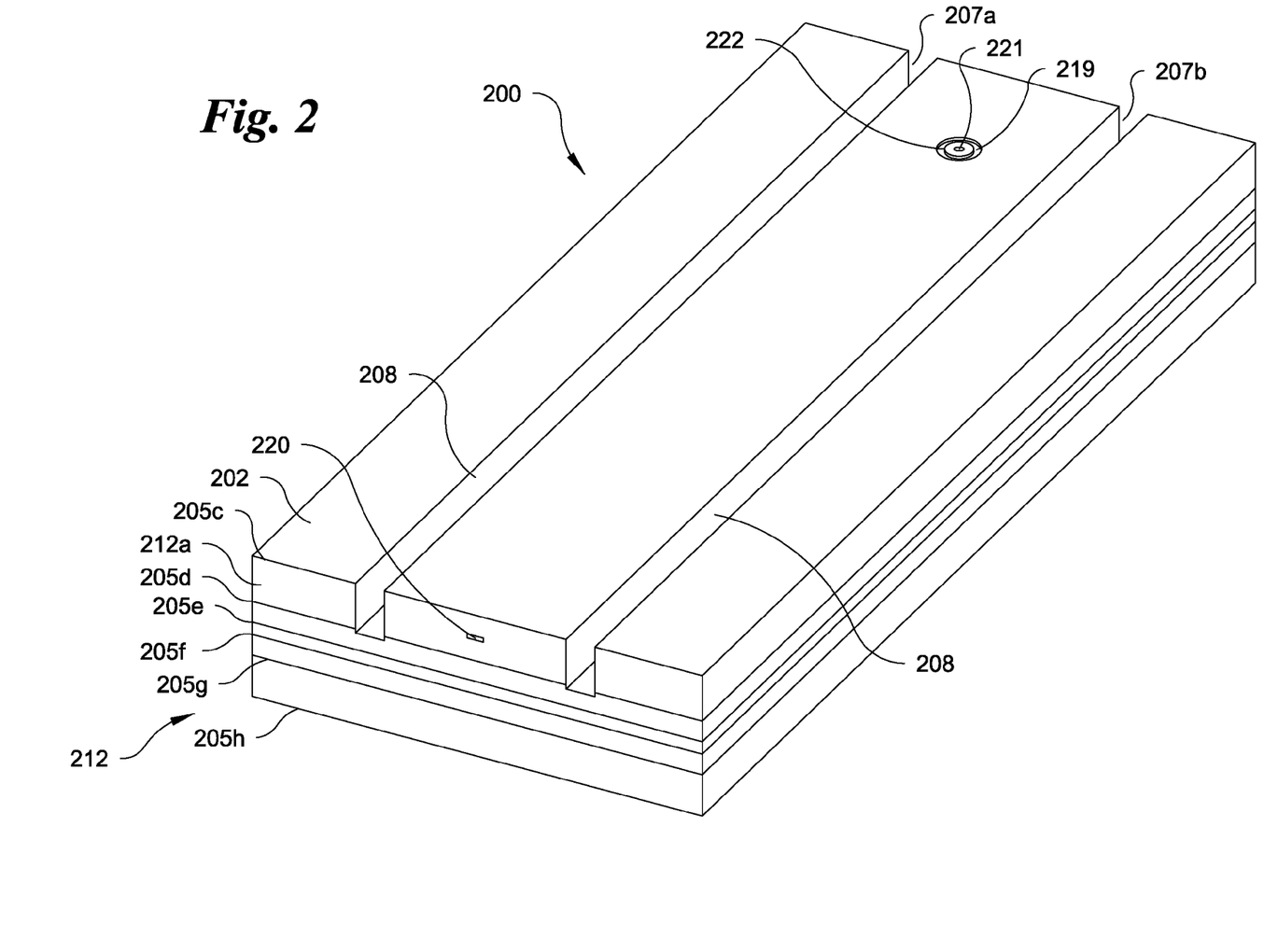
FIG. 2 illustrates an isometric view of a multilayer PCB substrate having two isolation channels and an embedded conductor according to an embodiment of the invention.

FIG. 2 illustrates a partial isometric cut-a-way view of a substrate 200 having a plurality of dielectric layers 212, where at least one of the dielectric layers, such as dielectric layer 212a, contains an embedded and elongated signal conductor 220 therein, and has on its upper and lower surfaces conductive ground (or other reference) planes 205c and 205d. Substrate 200 may be a multi-layer printed circuit board, in which reference plane 205c is layer 1, signal conductor 220 is a patterned layer 2, and reference plane 205d is layer 3. Further reference planes 205e, 205f, and 205g are shown. In the embodiment of FIG. 2, the elongated signal conductor 220 is embedded within a first one of the dielectric layers such as dielectric layer 212a and electrically shielded by an upper conductive reference plane 205c on an upper surface 202 of the first dielectric layer 212a; a lower conductive layer 205d on a lower surface of the first dielectric layer 212a; a first conductive groove 207a and second conductive groove 207b through the first dielectric layer 212a and through lower conductive layer 205d on opposing sides of the signal conductor 220, and extending continuously along the length of signal conductor 220. Grooves 207a and 207b, which may be equidistant from signal conductor 220, have conductive side walls 208 providing an electrical connection between the upper conductive reference plane 205c and lower conductive layer 205d. First and second conductive end walls, as explained below with reference to FIG. 3, join first groove 207a and second groove 207b, and provide an electrical connection between first groove 207a and second groove 207b. At least one insulating area 219 is provided through upper conductive reference plane 205c; an insulating area may also be provided through lower conductive reference plane 205d. A metalized via 221, which extends from insulating area 219 to conductor 220, thereby providing access for electrical connection to conductor 220, is provided. Conductive pad 222 within insulating area 219 is in electrical contact with metalized via 221. As will be explained in greater detail below with reference to FIG. 3, metallization of end walls of first dielectric layer 212a from conductive groove 207a to conductive groove 207b provides for shielding or isolation of the signal conductor 220 at front and back conductive surfaces. The conductive surfaces of conductive grooves 207a, 207b may be electrically connected to a point of reference such as electrical ground.

Figure 3:
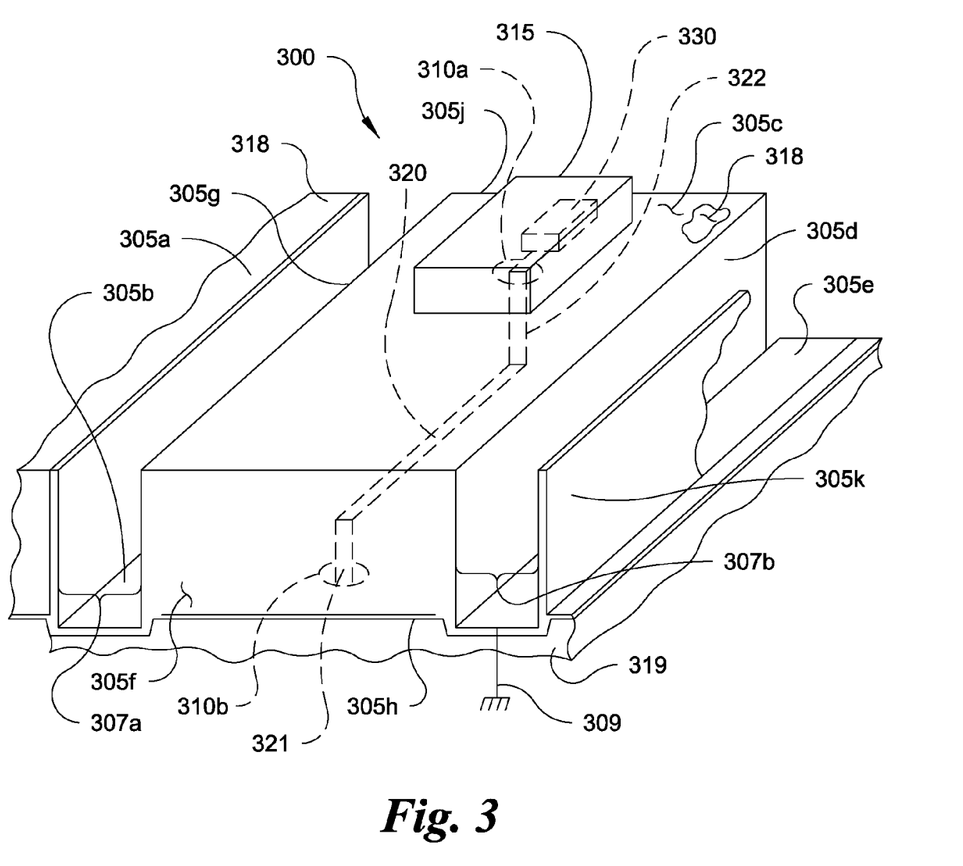
FIG. 3 illustrates an isometric view with cut-a-way of one layer in a multilayer PCB substrate having two isolation channels and an embedded conductor according to an embodiment of the invention.

FIG. 3 illustrates a partial perspective cut-a-way view of a PCB 300 with certain internal elements shown. PCB 300 has elongated electrical conductor 320 embedded in dielectric layer 318. PCB 300 has two grooves or isolation channels 307a, 307b, on opposing sides of and generally extending continuously parallel to and the entire length of conductor 320. Grooves 307a, 307b extend through dielectric layer 318, reference plane indicated at 305h, and into further dielectric layer 319. Groove 307a has a conductive bottom upperwardly facing surface 305b and a conductive first inwardly facing parallel side 305a and a conductive second inwardly facing parallel side 305g. It will be appreciated that conductive sides 305a, 305g may be metallization layers on a cut through dielectric layer 318. The two grooves 307a, 307b define the width of a portion of dielectric layer 318. The groove 307b, similar to its counterpart groove 307a, has conductive upperwardly facing bottom surface 305e and a conductive first associated inwardly facing parallel side 305d and a conductive second associated inwardly facing parallel side 305k (shown partially cut-a-way). The portion of the PCB 300 by way of example and not limitation shows the portion of dielectric layer 318 contained by six (6) outwardly facing conductive sides: 305d, 305f, 305g, and 305j in addition to conductive reference plane 305h and upper conductive layer 305c which define further conductive sides. The portion of dielectric layer 318 has therein an embedded electrical conductor 320. In one embodiment, other electronic components that interconnect to other conductors and components in the portions of the PCB 300 shown in FIG. 3 may also be embedded. Electrical connections to signal conductor 320 may be provided through insulating areas 310a, 310b in conductive layers 305c and 305h. Conductive via 321 connects to signal conductor 320 through insulating area 310b to provide for electrical connection to devices or conductors, which may be in further dielectric layer 319. Conductive via 322 connects to signal conductor 320 and connects through insulating area 310a to device 330. In the illustrated embodiment, isolation shield 315, which is a hollow body having conductive surfaces, covers via 322 and device 330. Connections between device 330 and other conductors may also be provided. All external surfaces of isolation shield 315 may be metalized, and in electrical contact with upper conductive layer 305c. Suitable isolation shields are available from various vendors. Isolation shield 315 prevents or reduces radiation emanating from conductor 320, via 322 and device 330. The shield 315 and the grooves 307a, 307b are typically electrically connected to a PCB reference such as a reference plane, as schematically indicated by reference to the symbol for ground 309. In another embodiment the PCB reference planes may be connected to a potential other than ground.

Figure 4A:
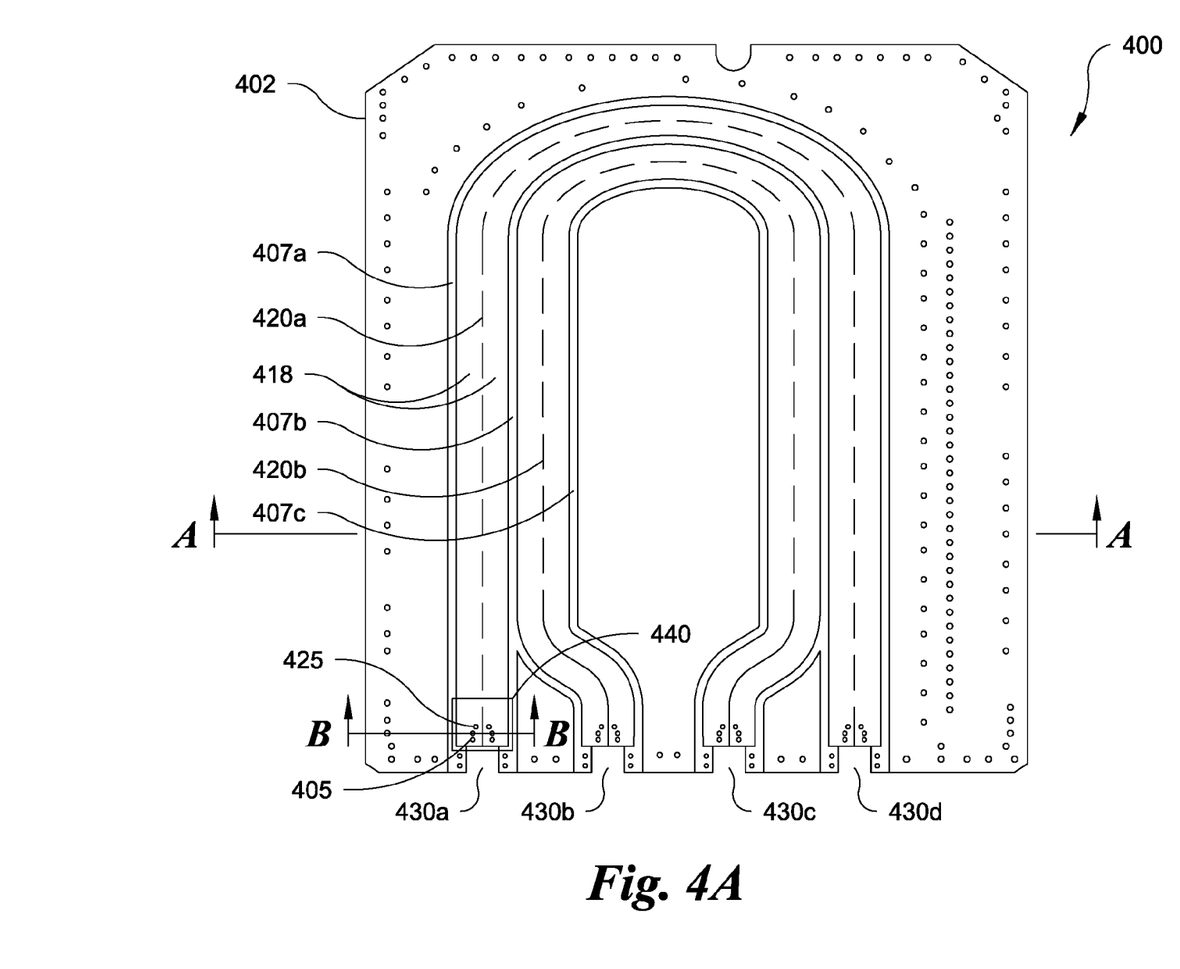
FIG. 4a illustrates a plan view of a PCB having two signal conductors and respective adjacent isolation channels according to an embodiment of the invention.
Figure 4B:
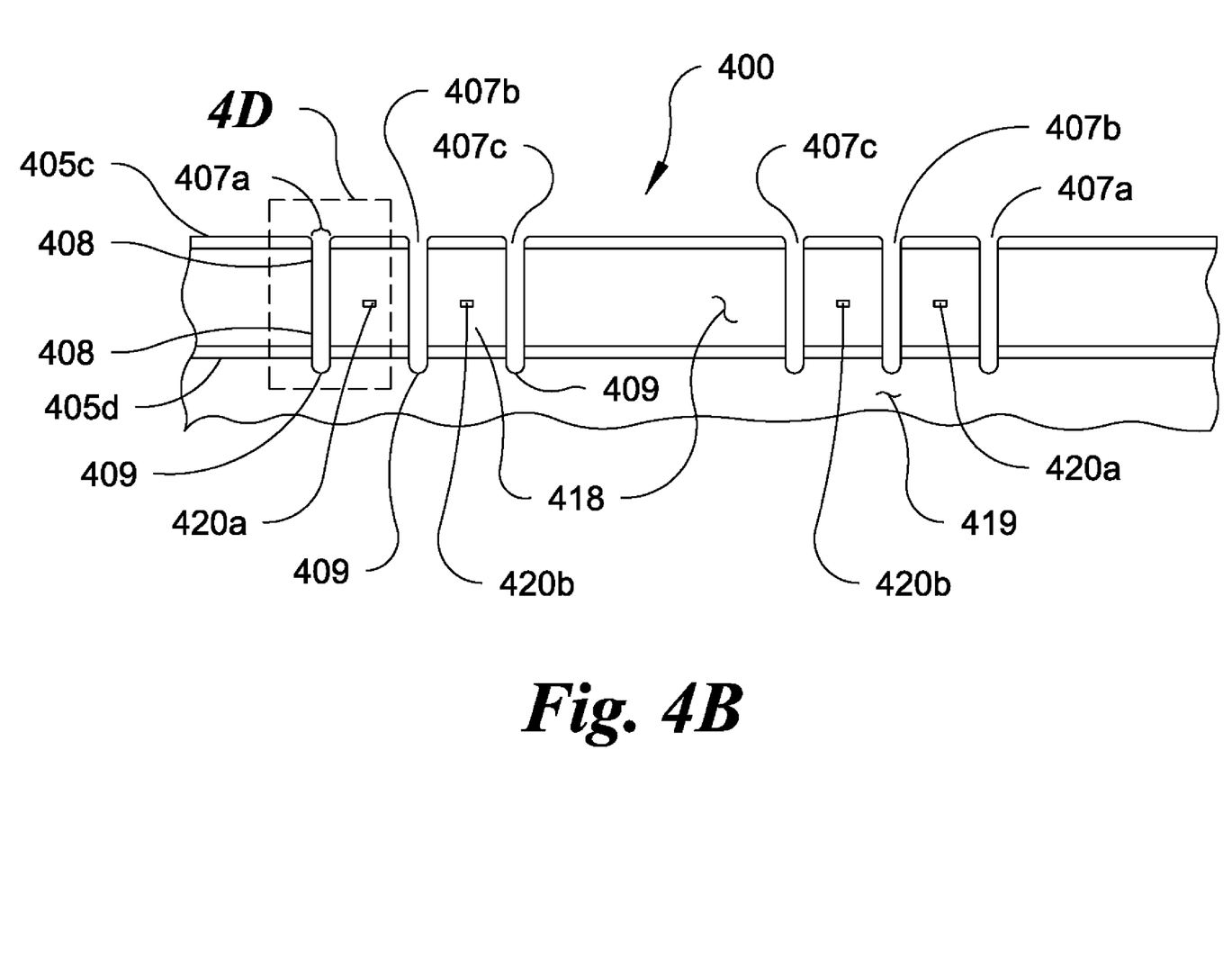
FIG. 4b illustrates a sectional view A-A of the PCB in FIG. 4a having two signal conductors and respective adjacent isolation channels according to an embodiment of the invention.

Any number of multiple grooves parallel to grooves 307a, 307b may extend continuously along the length of a signal conductor, whereby the multiple grooves have conductive side walls providing an electrical connection between upper and lower conductive layers In FIG. 4a, PCB 400 in accordance with an embodiment of the invention includes three grooves or isolation channels 407a, 407b and 407c. PCB 400 is exemplary and any number of multiple grooves parallel to grooves 407a, 407b and 407c may extend continuously along the length of a signal conductor. Each groove 407a, 407b and 407c has conductive side walls providing an electrical connection between upper and lower conductive layers. FIG. 4b, a section taken along line A-A of FIG. 4a, and FIG. 4d, which is an enlargement of the region marked 4d of FIG. 4b, illustrate that the grooves 407a, 407b and 407c, include a conductive bottom upperwardly facing surface and attached thereto two conductive inwardly facing sides as similarly described in connection with FIG. 3.

The groove 407a and groove 407b through a dielectric layer 418 are situated on opposing sides of the signal conductor 420a and extend continuously along the length of signal conductor 420a. The grooves 407a and 407b have conductive side walls 408 that provide an electrical connection between the upper conductive layer 405c and lower conductive layer 405d; first and second conductive end walls (not shown in the cut-a-way view) join first groove 407a and second groove 407b. Grooves 407a, 407b, 407c may extend through conductive layer 405d into a lower dielectric layer 419, partially shown. The bottom surfaces 409 of grooves 407a, 407b may also have a conductive coating to provide an electrical connection between the side walls 408.

Groove 407c similarly has a conductive upperwardly facing bottom surface 409 and a conductive first inwardly facing side and a conductive second inwardly facing side, which may be parallel to the first inwardly facing side. In an embodiment, a second elongated signal conductor 420b is embedded in dielectric layer 418 intermediate and generally parallel to grooves 407b and 407c. Two signal conductors 420a, 420b are embedded in dielectric layer 418 on opposing sides of conductive groove 407b. Other electronic components (not shown) that interconnect to other conductors and components in the portions of the PCB 400 not shown in the illustration may also be provided in dielectric layers 418 and 419.

Figure 4C:
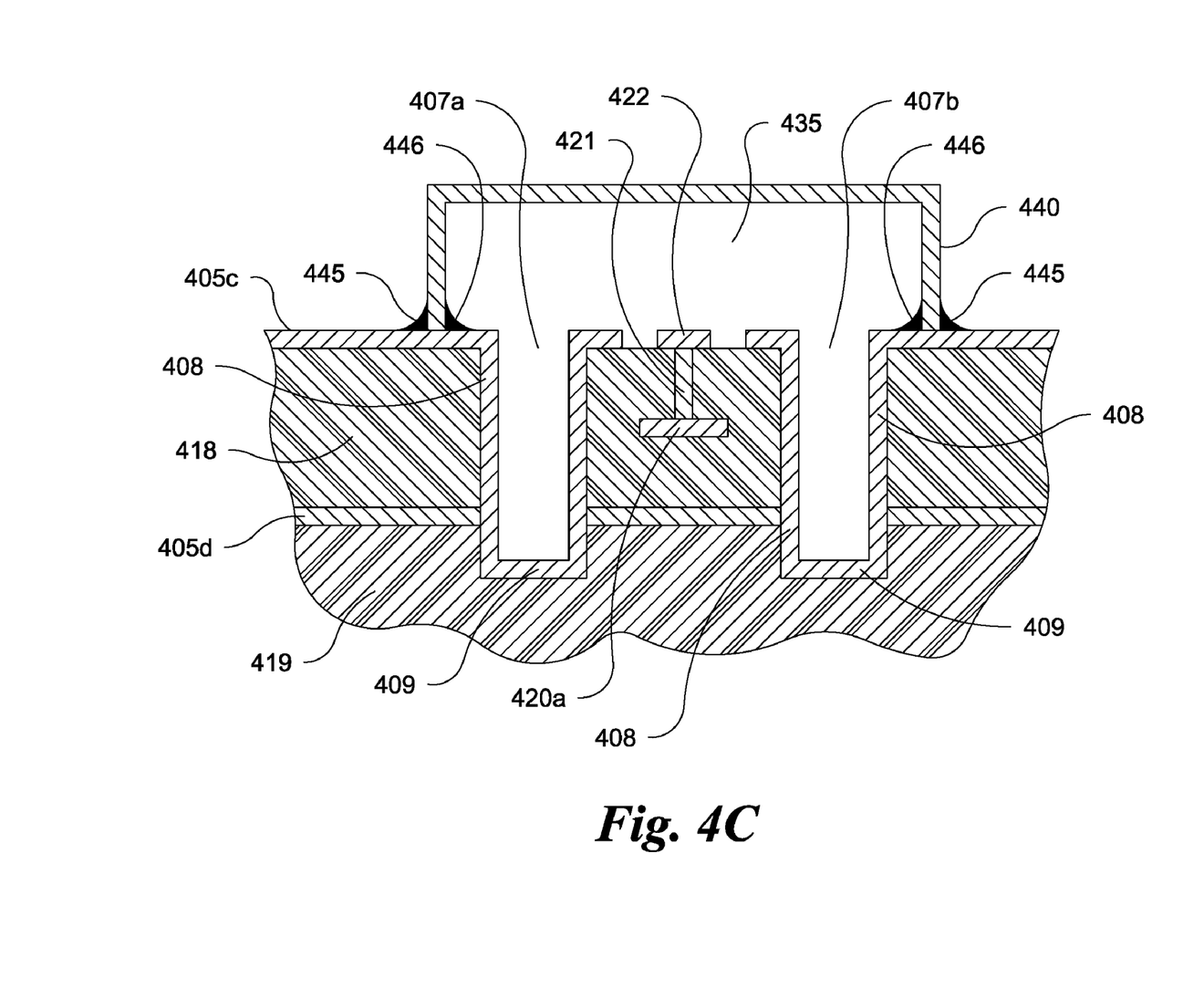
FIG. 4c illustrates a partial sectional view B-B of the PCB in FIG. 4a having one signal conductor and respective adjacent isolation channels according to an embodiment of the invention.
Figure 4D:
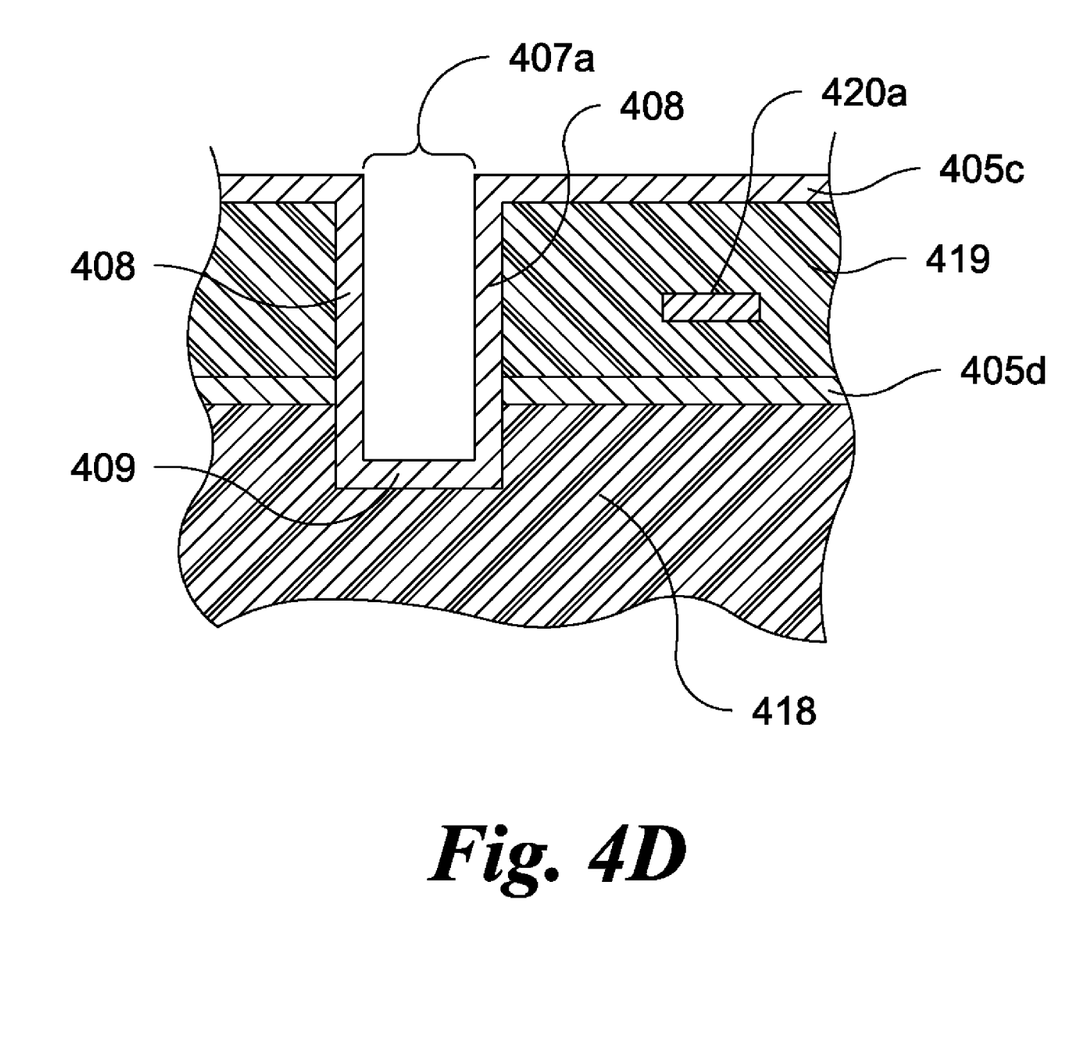
FIG. 4d is an enlargement of the region marked 4d of FIG. 4b.

As shown in FIG. 4C, which is a sectional view along line B-B of FIG. 4A, a hollow isolation shield 440 having conductive walls is provided to define an electrically insulating volume 435 above upper conductive surface 405c. Conductive via 421 may be defined within dielectric layer 418, contacting conductor 420a and providing an electrical connection to conductive pad 422, which may be defined by patterning upper conductive surface 405c to provide an insulating gap. Conductive via 421, is electrically isolated from upper conductive surface 405c and is within insulating volume 435. Pad 422 provides a point of access to conductor 420a. Isolation shield 440 may be grounded by way of example to a conductive member such as upper conductive surface 405c, thereby minimizing or preventing any external electrical radiation from the signal conductor and via. Isolation shield 440 is further physically mounted and electrically connected to upper conductive surface 405c by a solder joint 445 around its exterior surface at its base and solder joint 446 around its interior surface at its base. Grooves 407a, 407b are on opposing sides of conductor 420a and extend through upper conductive surface 405c, dielectric layer 418, and conductive layer 405d into dielectric layer 419. Grooves 407a, 407b have conductive side walls 408 and conductive bottom surfaces 409.

Referring again to FIG. 4A, slots 430a, 430b, 430c, 430d permit a connector to be attached to PCB 400. Connections to conductor 420a are provided at slots 430a, 430d, and connections to conductor 420b may be provided at slots 430b, 430c. One of the conductive end walls (not shown) that joins grooves 407a, 407b and 407c, and conductive layers 405c, 405d, is intermediate the point of access and slot 430a. The others of the conductive end walls that join grooves 407a, 407b and 407c, and conductive layers 405c, 405d are similarly located intermediate the others of slots 430b, 430c, 430d.

Figure 5:
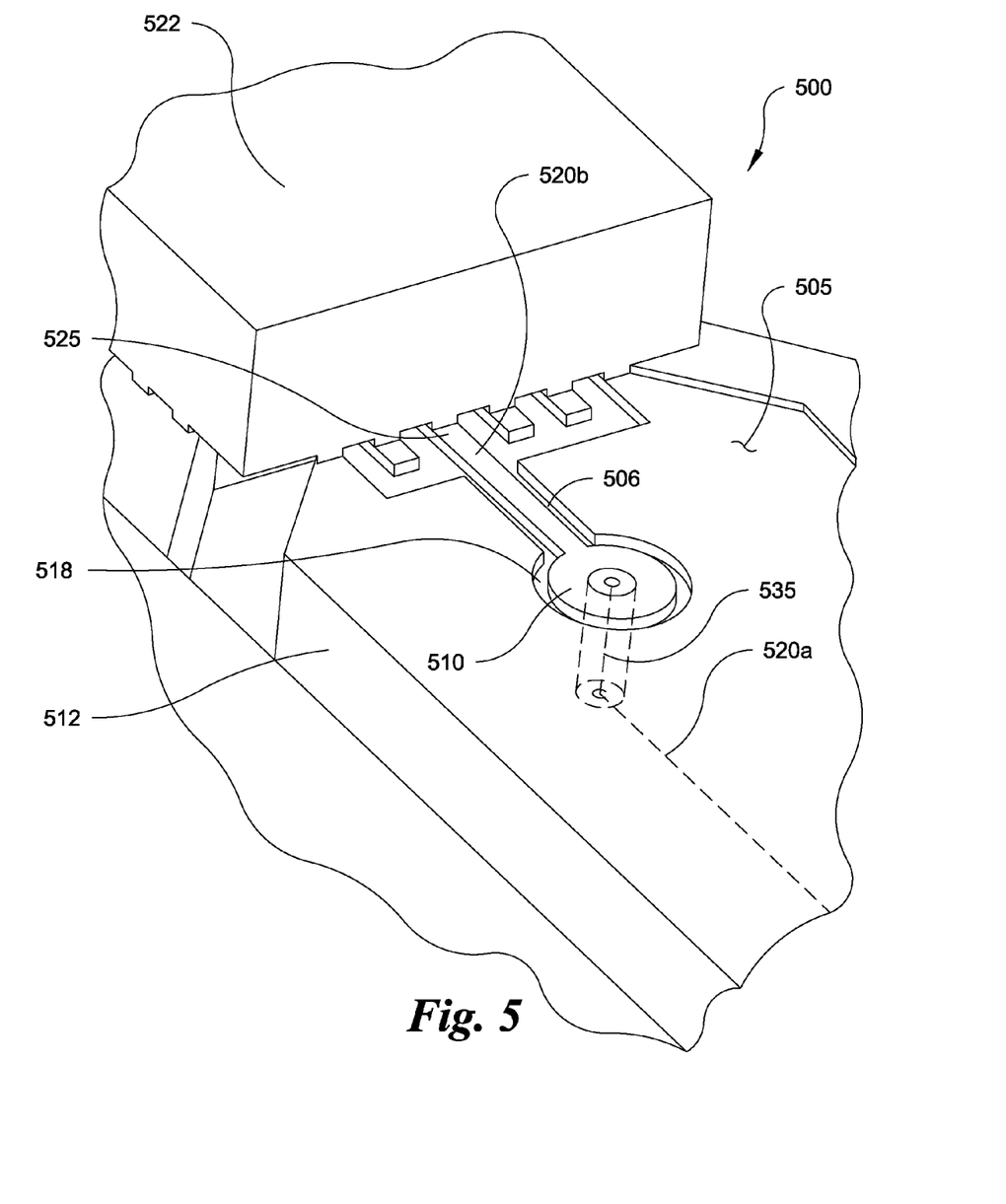
FIG. 5 illustrates an isometric view of a circuit component connected to an embedded conductor having isolation channels according to an embodiment of the invention.

In FIG. 5 a PCB 500 in accordance with an embodiment of the invention includes an electrical device 522, such as an integrated circuit encased in a housing. For ease of illustration, PCB 500 is shown having one dielectric layer 518 in a breakaway view, but a multi-layer circuit board may be provided as well. Dielectric layer 518 has a conductive groove side surface 512 and a conductive layer 505 on its top surface, and has embedded therein an elongated conductive signal member 520a. Conductive via 535 provides an electrical connection between conductive member 520a and a conductive pad 510 defined on the top surface of dielectric layer 518. Conductive member 520a is referred to as a stripline. Pad 510 is electrically isolated from top surface 505 by a continuous gap 506 through conductive layer 505 to dielectric layer 518. Pad 510 on the surface of dielectric layer 518 connects to elongated conductor 520b; conductor 520b is electrically isolated from surface 505 by insulating gap 506 through conductive layer 505. Conductor 520b in turn attaches to solderable pad 525. In an embodiment, an isolating shield, such as isolating shield 315 of FIG. 3, or isolation shield 440 of FIG. 4a and FIG. 4c, may be provided over pad 510, solderable pad 525, the exposed trace between the pads, and all or part of electrical device 522.

Figure 6:
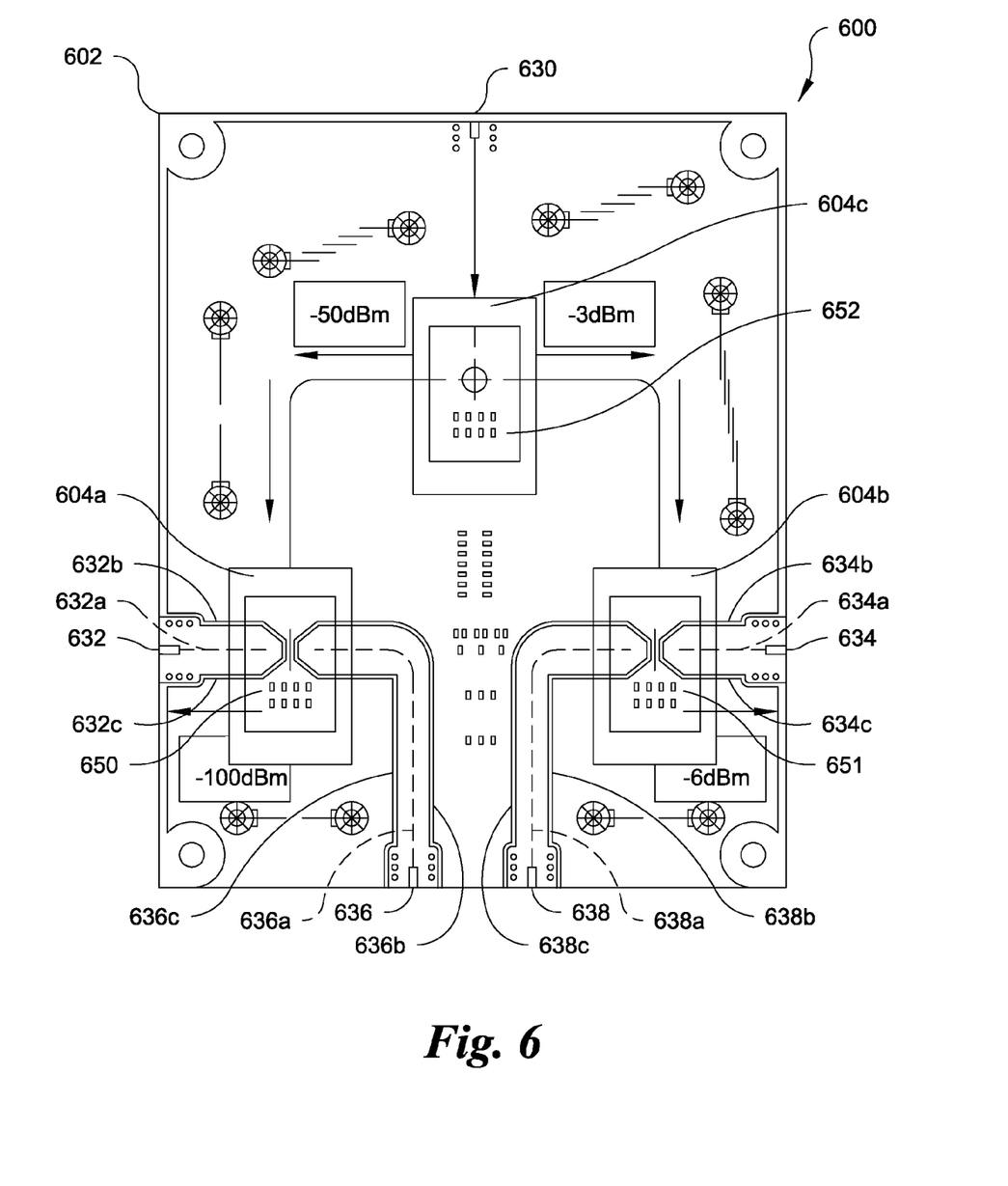
FIG. 6 illustrates a plan view of a PCB having isolation channels and foundation reference planes according to an embodiment of the invention.

In FIG. 6, a plan view of PCB 600 in accordance with an embodiment of the invention is shown. When assembled, PCB 600 will serve as a board for a set of cascaded switches, having an input at 630 and outputs at 632, 634, 636 and 638. The switches will be mounted on PCB 600 at three areas 650, 651, 652 bounded by rectangular solder areas 604a, 604b and 604c, respectively, for mounting of isolation shields. The PCB 600 represents one layer in a multiple layer PCB arrangement as earlier described in connection with FIG. 2. The areas 650, 651, 652 bounded by solder areas 604a, 604b and 604c will have isolation shields mounted thereon, which will serve to provide electrical isolation for switches and associated electrical devices that will be inserted into the areas 650, 651, 652 during the assembly process. Line 632a represents the location of an internal signal conductor, i.e., a signal conductor that is not on an exterior surface of PCB 600, which connects the output of a switch located at location 650 to output 632. The signal conductor may be defined in a suitably patterned conductive layer in a multi-layer substrate. Isolation channels 632b, 632c are associated with the signal conductor and serve to isolate the signal conductor. Line 636a represents the location of an internal signal conductor that connects an output of the switch at location 650 to output 636a. The signal conductor may be defined in a suitably patterned conductive layer in a multi-layer substrate. Isolation channels 636b, 636c are associated with the signal conductor and serve to isolate the signal conductor. Similarly, line 634a represents the location of an internal signal trace that connects to an output of a switch at location 651. The signal trace at line 634a is isolated by isolation channels 634b, 634c. Line 638a represents the location of an internal signal trace that connects to another output of the switch at location 651. The signal trace at line 638a is isolated by isolation channels 638b, 638c. It will be appreciated that the isolation channels 632b, 632c, 634b, 634c, 636b, 636c, 638b, 638c are each in electrical contact with two conductive layers, or reference planes, as well as with conductive end walls that join the isolation channels and reference planes, as described and illustrated in greater detail above with reference to FIG. 3. Referring again to FIG. 6, in the PCB 600, coupling among high frequency signals along the signal conductors indicated by lines 632a, 634a, 636a, 638a, is substantially reduced or eliminated as a result of the conductive isolation channels electrically connecting reference planes and end walls. As noted above, shields, similar to shield 315 as described in FIG. 3, may be provided to isolate areas 650, 651, 652, and electrically connect to a surface reference plane.

Figure 7:
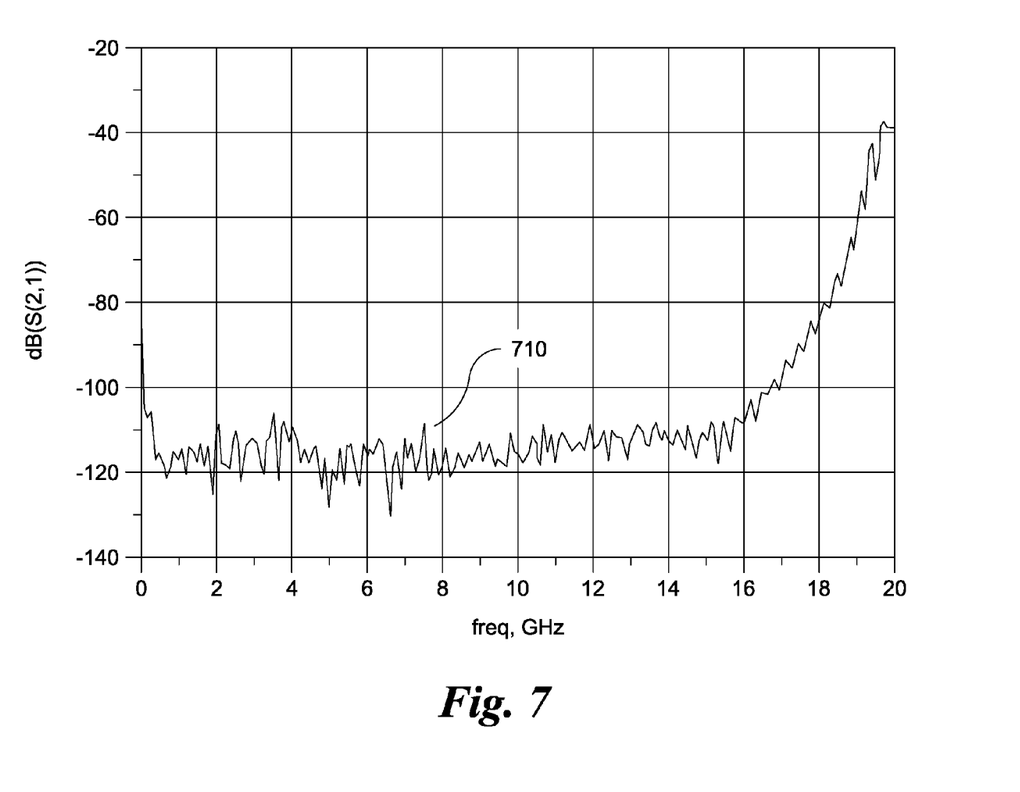
FIG. 7 illustrates a plot against frequency of detected signal strength in a conductor in a multi-layer printed circuit board routed parallel to a conductor carrying a signal, where the two conductors are isolated by isolation channels according to an embodiment of the invention.

FIG. 7 illustrates a frequency plot 710 of the relative magnitude of a signal detected at output 430b of FIG. 4, based on a signal transmitted at 430a. In the tested example, the traces were approximately 9 inches in length, and separated from one another by about 0.55 inches. In the absence of the disclosed structure of grooves and connectors, the coupling is about 40 dB. A dielectric material referred to as Rogers RO4350™ laminate was used to embed the stripline traces and the isolation channels. The RO4350™ laminate is one of Rogers RO4000® family of high frequency materials. RO4350 is a trademark of Rogers Corporation and Rogers is a registered trademark of Rogers Corporation. Measurements of S-parameters were made using a frequency generator and a spectrum analyzer and plotted as shown in FIG. 7. The measurement was made, in summary, by determining the magnitude of radio frequency reception in one stripline signal conductor (see, FIG. 4, 420a) as a signal with frequencies as shown on the abscissa were swept across the frequency spectrum in the adjacent stripline conductor (see, FIG. 4, 420b). The analyzer connections to the PCB trace were made using SMA connectors and co-axial cable. As indicated by the plot FIG. 7, the isolation between the two striplines in the frequency range 1 GHz to about 17 GHz remained below −100 db. Those having ordinary skill in the art of high frequency electrical engineering will understand the method of testing described herein.

Figure 8A:
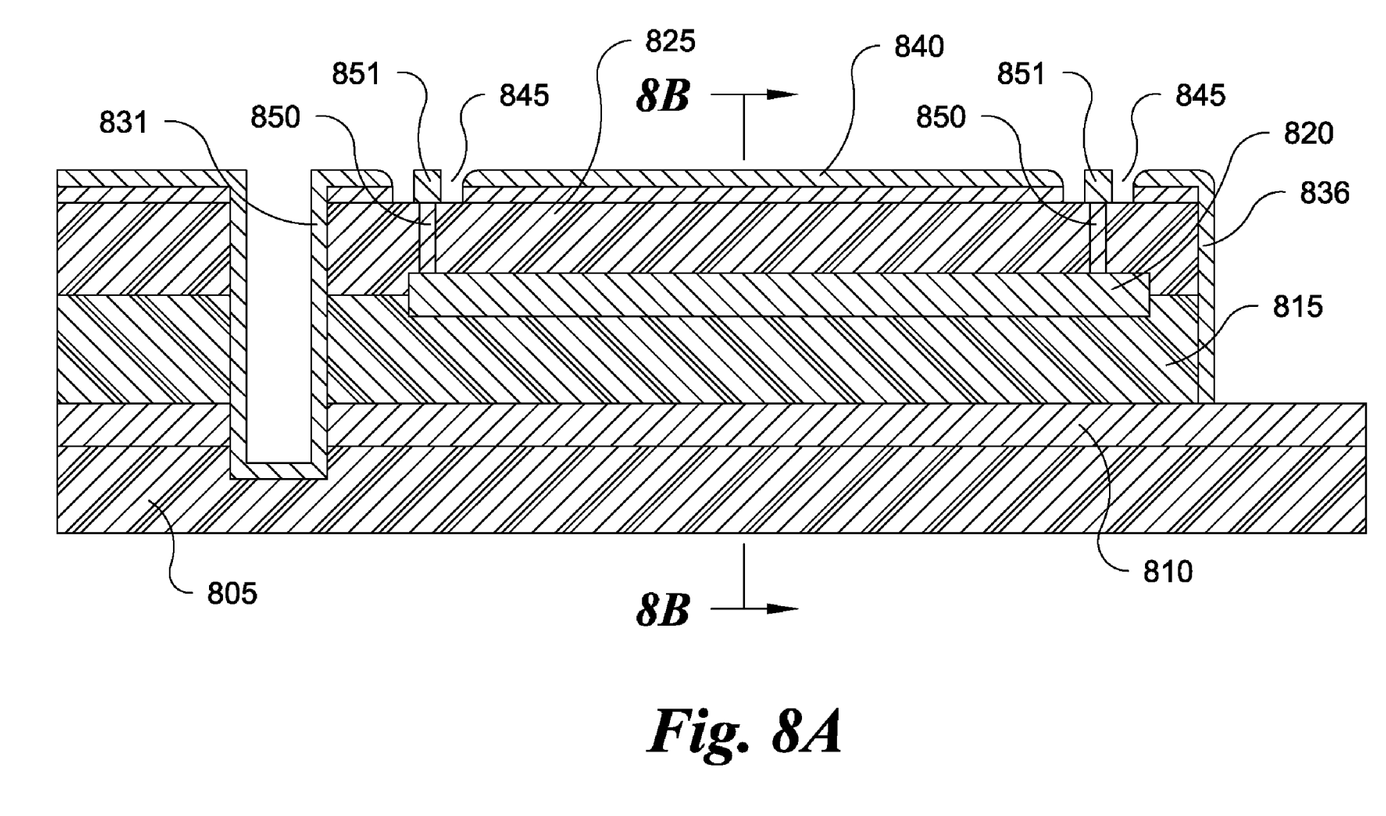
FIGS. 8A and 8B are cross-sectional views of a printed circuit board having an isolating structure defined therein according to an embodiment of the invention.
Figure 8B:
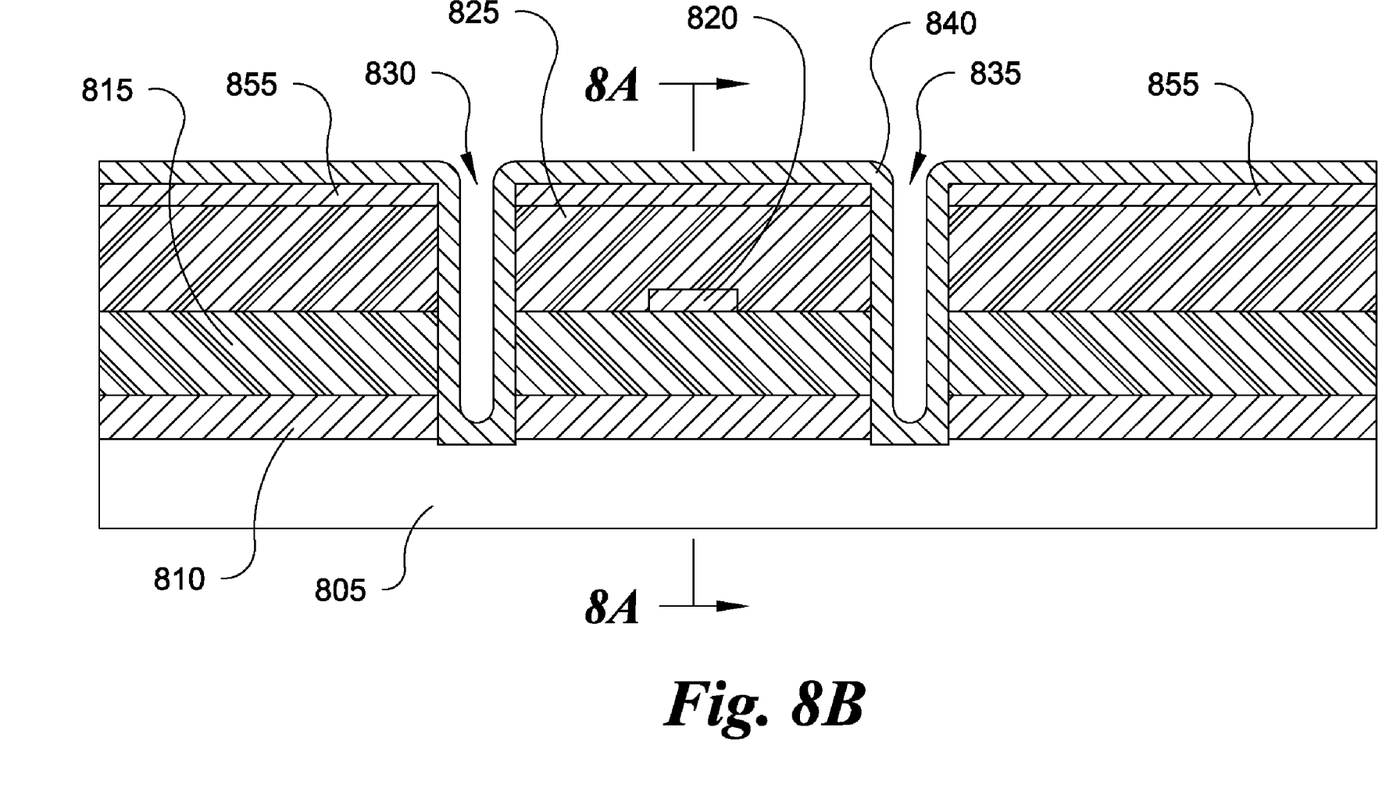

Referring now to the cross-sections shown in FIGS. 8A and 8B, a method for manufacturing a multi-layer printed circuit board incorporating a structure for isolating a signal conductor will be explained. A first planar dielectric layer 805 is provided. Layer 805 may be of any suitable dielectric material, including, by way of example, Rogers RO4350™ laminate described above. A first conductive reference plane 810 is formed on the first planar dielectric layer 805. First conductive reference plane 810 may be of copper, and may be formed by electroplating or other suitable techniques. A second planar dielectric layer 815 is provided on the first conductive reference plane 810. Those of ordinary skill in the art are familiar with techniques of laminating dielectric layers, such as the use of bonding films and the application of heat and pressure to form the PCB. An elongated signal conductor 820 is formed on second planar dielectric layer 815 opposing the first conductive reference plane 810. Elongated signal conductor 820 may be defined in a suitably patterned conductive layer. Known techniques of plating and etching may be employed for defining the elongated signal conductor 820, which may be of copper. A third planar dielectric layer 825 may be provided on the signal conductor 820 and the second planar dielectric layer 815. A second conductive layer 855 is formed on the third planar dielectric layer 825. Two grooves 830, 835 may be defined on opposite sides of elongated signal conductor 820 through second conductive layer 855, third planar dielectric layer 825, second planar dielectric layer 815 and first reference plane 810. Grooves 830, 835 may be defined by milling through second conductive layer 855, third dielectric layer 825, second dielectric layer 815 and reference plane 810 into first dielectric layer 805. A conductive layer 840 is applied on the grooves and on an upper surface of second conductive layer 855. The grooves 830, 835 have inner walls that join to one another beyond opposing ends of elongated signal conductor 820, such as at 831, 836. The conductive layer 840 covers the inner walls. Signal access areas 845 may be provided through second planar conductive layer 855 and conductive layer 840 in alignment with the signal conductor 820, and particularly at the ends of the signal conductor 820. Signal access areas 845 are insulating areas that expose third dielectric layer 825 to provide conductor access. Suitable patterning and etching techniques may be employed to define signal access areas 845. Vias 850 may be provided to signal conductor 820, using drilling and plating techniques. In an embodiment, after plating the walls of the vias, a step of filling may be performed to fill the vias with a metal. Conductive pads 851 may be provided on vias 850.

A variety of conductive materials, such as gold, silver and copper, may be employed for the conductive coatings. Electroplating and hot air solder level (HASL) techniques may be employed. In an embodiment, nickel and gold may be applied by the Electroless Nickel Immersion Gold (ENIG) process. An exemplary coating may be a layer of copper, covered by a layer of nickel, covered by a layer of gold. In an embodiment in which grooves are defined in a PCB, a layer of copper may be a first conductive layer applied after milling or otherwise defining grooves. Tin-lead electroplating may also be employed. In an embodiment in which grooves are defined in a substrate according to thick film technology, a layer of gold may be a first conductive layer applied after milling or otherwise defining grooves. It has been found that a desirable slot depth to width ratio as for example required for the isolation grooves is approximately 1.5:1.0. Those having ordinary skill in the art of PCB engineering will understand the method of manufacturing described herein.

The conductive layer on the grooves and upper surfaces may have a thickness of about one ten thousandth (0.0001) inches to several thousandths (0.001) of an inch. In an implementation, the conductive layer may have a thickness of about 0.001 inch.

The description of the invention and embodiments herein is merely exemplary in nature and, thus, numerous modifications and variations are within the scope of the invention.

What is claimed is:

1. A substrate, comprising:
   a plurality of dielectric layers;
   an elongated signal conductor embedded within a first of the plurality of dielectric layers;
   an upper conductive layer on an upper surface of the first dielectric layer;
   a lower conductive layer on a lower surface of the first dielectric layer;
   a first conductive groove and second conductive groove through the first dielectric layer and the lower conductive layer and extending continuously along the length of and on opposing sides of the signal conductor, said grooves having conductive side walls providing an electrical connection between the upper conductive layer and the lower conductive layer; first and second conductive end walls joining said first groove and second groove; and at least one insulating area defined in at least one of the upper and lower conductive surfaces to provide an access to the signal conductor.

2. The substrate of claim 1, further comprising a conductive via extending from said insulating area to said signal conductor.

3. The substrate of claim 1, further comprising an isolation shield over the insulating area at a location of the conductive via.

4. The substrate of claim 3, wherein the isolation shield is soldered to the upper conductive layer.

5. The substrate of claim 1, wherein the substrate is a multi-layer printed circuit board.

6. The substrate of claim 1, wherein the conductive side walls comprise nickel covered by gold.

7. The substrate of claim 1, further comprising:
- a second elongated signal conductor in said first dielectric layer and separated from said elongated signal conductor by said first groove; and
- a third groove extending continuously generally parallel to the second signal conductor opposite to the first signal conductor extending continuously along the length of the second signal conductor, said third groove having conductive side walls providing an electrical connection between the upper and lower conductive layers.

8. The substrate of claim 7, wherein the substrate is a multi-layer printed circuit board.

9. A method for manufacturing a substrate, comprising the steps of:
- providing a first planar dielectric layer;
- forming a first conductive reference plane on the first planar dielectric layer;
- providing a second planar dielectric layer on the first conductive reference plane;
- forming an elongated signal conductor on the second planar dielectric layer;
- providing a third planar dielectric layer on the signal conductor and the second planar dielectric layer;
- defining on each side of said elongated signal conductor a groove extending continuously the entire length of said elongated signal conductor through said third planar dielectric layer, said second planar dielectric layer and said first conductive reference plane, said grooves having inner walls joining to one another beyond opposing ends of said elongated signal conductor;
- applying a conductive layer on said grooves, including said inner walls, and on an upper surface of said third planar dielectric layer; and
- defining an insulating signal access area through the conductive layer in alignment with said signal conductor.

10. The method for manufacturing a substrate of claim 9, wherein said step of defining two grooves comprises milling through said third planar dielectric layer, said second dielectric layer and said first reference plane.

11. The method for manufacturing a substrate of claim 9, wherein the step of applying comprises metallization.

12. The method for manufacturing a substrate of claim 11, wherein the step of metallization comprises providing a layer of copper.

13. The method for manufacturing a substrate of claim 11, wherein the step of metallization comprises providing a layer of gold.

14. A structure for isolating a signal conductor in a substrate having a first planar dielectric layer, a first conductive reference plane on the first planar dielectric layer, a second planar dielectric layer on the first conductive reference plane, an elongated signal conductor on a side of the second planar dielectric layer opposing the first conductive reference plane, a third planar dielectric layer on the signal conductor and the second planar dielectric layer, comprising:
- two grooves, each on one side of said elongated signal conductor through said third planar dielectric layer, said second planar dielectric layer and said first conductive reference plane, said grooves having inner walls joining to one another beyond opposing ends of said elongated signal conductor, said grooves having a conductive layer on their inner walls and in electrical contact with said first conductive reference plane; and
- an upper conductive layer on an upper surface of said third planar dielectric layer in electrical contact with said conductive layer on said walls of said grooves; and,
- an insulating signal access area in alignment with said signal conductor, defined through said upper conductive layer to the upper surface of said third planar dielectric layer.

15. The structure of claim 14, wherein said conductive layer on said inner walls of said grooves comprises copper.

16. The structure of claim 14, wherein said conductive layer on said inner walls of said grooves comprises gold.

17. The structure of claim 14, wherein said substrate is a multi-layer printed circuit board.

18. The structure of claim 14, wherein said conductive layer on said inner walls of said grooves comprises a layer of copper, covered by a layer of nickel, covered by a layer of gold.

19. The structure of claim 14, further comprising a conductive via between said insulating signal access area and in electrical contact with said signal conductor.

20. The structure of claim 19, further comprising a conductive pad on said third planar dielectric layer in said insulating signal access area and in electrical contact with said via.

* * * * *